United States Patent
Chen

(10) Patent No.: US 8,884,803 B2
(45) Date of Patent: Nov. 11, 2014

(54) AD CONVERTER APPARATUS, AD CONVERTER CIRCUIT, AND AD CONVERSION METHOD

(71) Applicant: Fujitsu Limited, Kawasaki (JP)

(72) Inventor: Yanfei Chen, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/874,882

(22) Filed: May 1, 2013

(65) Prior Publication Data

US 2013/0328709 A1    Dec. 12, 2013

(30) Foreign Application Priority Data

Jun. 8, 2012   (JP) .................................. 2012-131007

(51) Int. Cl.
*H03M 1/38* (2006.01)
*H03M 1/12* (2006.01)
*H03M 1/16* (2006.01)

(52) U.S. Cl.
CPC ............... *H03M 1/12* (2013.01); *H03M 1/165* (2013.01); *H03M 1/1225* (2013.01)
USPC .......................................... 341/161; 341/155

(58) Field of Classification Search
CPC ............ H03M 1/42; H03M 1/44; H03M 1/38
USPC .................................................. 341/161, 155
See application file for complete search history.

(56) References Cited

U.S. PATENT DOCUMENTS

| 6,437,717 | B1  |   | 8/2002 | Van der Ploeg et al. |
| 6,879,277 | B1  | * | 4/2005 | Cai ............................... 341/155 |
| 7,330,145 | B2  | * | 2/2008 | Van Der Ploeg .............. 341/161 |
| 7,551,115 | B2  | * | 6/2009 | Bailey et al. .................. 341/161 |
| 8,487,803 | B1  | * | 7/2013 | Garrity ......................... 341/161 |
| 8,497,794 | B2  | * | 7/2013 | Etou et al. .................... 341/161 |
| 2009/0184857 | A1 |   | 7/2009 | Furuta et al. |
| 2010/0007542 | A1 |   | 1/2010 | Morimoto |

FOREIGN PATENT DOCUMENTS

| JP | 2003-505193 A | 2/2003 |
| JP | 2009-164914 A | 7/2009 |
| JP | 2010-021918 A | 1/2010 |

* cited by examiner

*Primary Examiner* — Brian Young
(74) *Attorney, Agent, or Firm* — Arent Fox LLP

(57) ABSTRACT

An analog-digital converter apparatus includes a plurality of AD converters connected in series, each AD converter to convert an analog signal received by a first AD converter, at least one of the AD converters including: a residual signal generator that generates a first residual signal, the first residual signal being a difference between the analog signal or one of two residual signals amplified and output by a preceding AD converter and a first reference signal, and a second residual signal, the second residual signal being a difference between the analog signal or one of the two residual signals and a second reference signal; and an amplifier that amplifies and outputs the first residual signal to a subsequent AD converter at a first timing and amplifies and outputs the second residual signal to the subsequent AD converter at a second timing.

9 Claims, 10 Drawing Sheets

AD CONVERTER APPARATUS, AD CONVERTER CIRCUIT, AND AD CONVERSION METHOD

CROSS-REFERENCE TO RELATED APPLICATION

This application is based upon and claims the benefit of priority of the prior Japanese Patent Application No. 2012431007, filed on Jun. 8, 2012, the entire contents of which are incorporated herein by reference.

FIELD

The embodiments discussed herein are related to an analog-digital (AD) converter apparatus, an AD converter circuit, and an AD conversion method.

BACKGROUND

Currently available as one type of AD converter apparatuses is a pipeline type AD converter apparatus. The pipeline type AD converter apparatus performs an AD conversion operation by a plurality of stages, and an AD converter at each stage outputs AD conversion results by M bits (M is an integer equal to one or more).

At least one of the AD converters has digital-analog (DA) function that converts an AD conversion result into an analog signal and amplifies a difference (referred to as a residual signal) between the DA conversion result and the analog signal input to the AD converter by $2^M$ times through an amplifier. A subsequent AD converter receives the amplified residual signal as an analog signal, and outputs an AD conversion result at a lower bit.

If gain of $2^M$ of the amplifier of each AD converter varies, an accurate AD conversion result may be difficult to obtain.

To address this problem, a dual-residue pipeline type AD converter apparatus has been disclosed. Each AD converter in this AD converter apparatus generates two residual signals. One residual signal is a difference between an input signal and a reference signal closest, to the magnitude of the input signal, and the other residual signal is a difference between the input signal and a reference signal next closest to the input signal. The two residual signals are amplified by separate amplifiers with the same gain, and then input to a subsequent AD converter. The subsequent AD converter receives as input signals the two amplified residual signals, determines a reference level, and outputs an AD conversion result at a lower bit. In this technique, the gain of the amplifier of each AD converter may not necessarily be $2^M$.

The above-described techniques are disclosed in Japanese Laid-open Patent Publication No. 2009-164914 and Japanese National Publication of International Patent Application No. 2003-505913, for example.

SUMMARY

However, the AD converter that generates the two residual signals includes two amplifiers. When the two amplifiers have an offset variation therebetween, an accuracy in the AD conversion may be degraded.

According to an aspect of the embodiment, an analogue-digital (AD) converter apparatus includes a plurality of AD converters connected in series, each AD converter to convert an analog signal received by a first AD converter, at least one of the AD converters including: a residual signal generator that generates a first residual signal, the first residual signal being a difference between the analog signal or one of two residual signals amplified and output by a preceding AD converter and a first reference signal, and a second residual signal, the second residual signal being a difference between the analog signal or one of the two residual signals and a second reference signal; and an amplifier that amplifies and outputs the first residual signal to a subsequent AD converter at a first timing and amplifies and outputs the second residual signal to the subsequent AD converter at a second timing.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Embodiments are, described with reference to the drawings.

Figure 1:
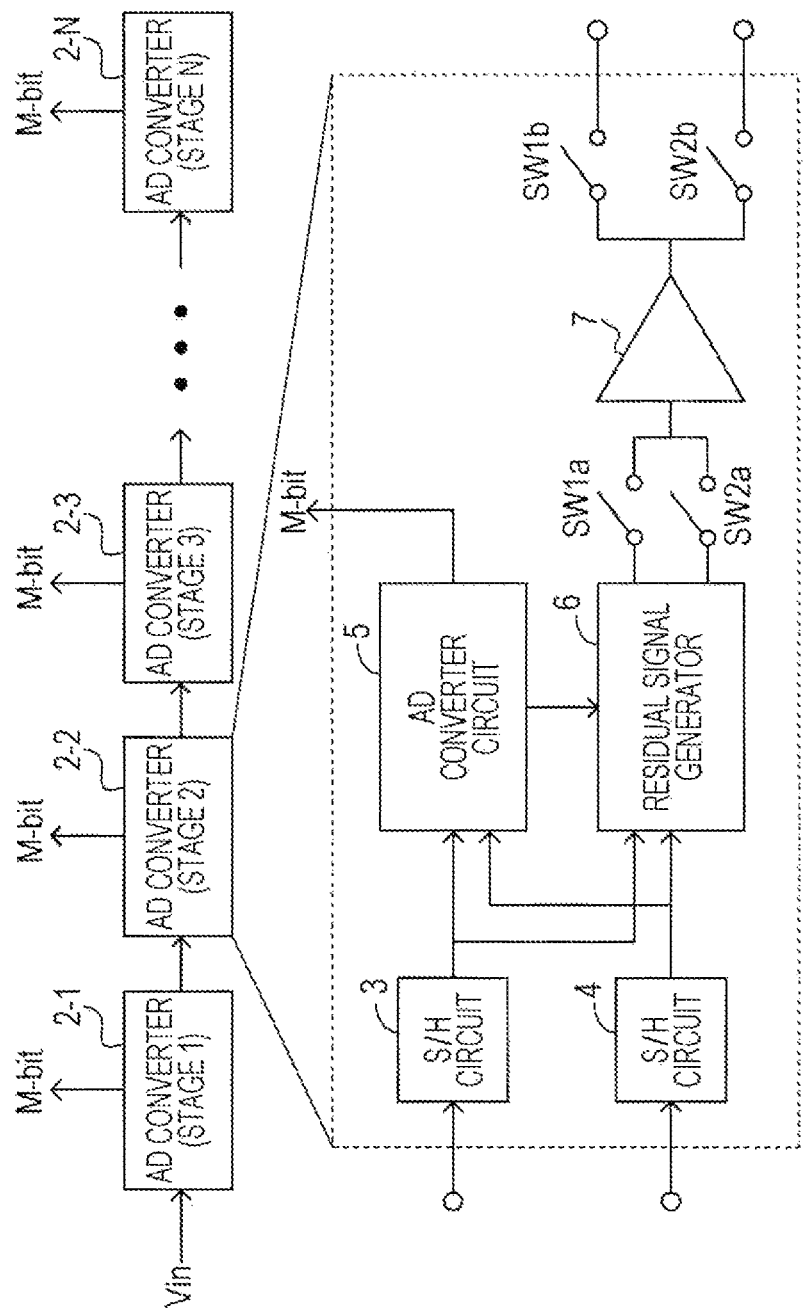
FIG. 1 is an example of an AD converter apparatus of a first embodiment.

FIG. 1 illustrates an example of an analog-digital (AD) converter apparatus 1 of a first embodiment.

The AD converter apparatus 1 is an example of a pipeline type AD converter apparatus, and includes a plurality of AD converters 2-1, 2-2, 2-3, . . . , 2-N connected in series. Each of the plurality of AD converters 24 through 2-N performs by a specific bit number M (M is 1 or a plural number) an AD conversion operation on an analog signal Vin received at a first stage thereof. In the example of the AD converter apparatus 1, N is greater than 3, but N may be equal to or greater than 2.

In the following discussion, the AD conversion operations of the AD converters 2-1 through 2-N are respectively referred to as the AD conversion operations of stages 1, 2, 3, . . . , N. The AD conversion operation of stage 1 results in the most significant bit (MSB) of a digital signal, and the AD conversion operation of stage N results in the least significant bit (LSB) of the digital signal.

At least one of the plurality of AD converters 24 through 2-N determines as a first residual signal a difference between a first reference signal and the analog signal or one of two residual signals amplified and output by a preceding AD converter. The AD converter also determines as a second residual signal a difference between a second reference signal and the analog signal or one of the two residual signals amplified and output by the preceding AD converter. At a first timing, the AD converter amplifies the first residual signal through an amplifier thereof and then outputs the amplified first residual signal to a subsequent AD converter. At a second timing, the AD converter amplifies the second residual signal through the same amplifier thereof and then outputs the amplified second residual signal to the subsequent AD converter.

FIG. 1 illustrates an example of the AD converter 2-2.

The AD converter 2-2 includes sample-hold (S/H) circuits 3 and 4, AD converter circuit 5, residual signal generator 6, switches SW1a, SW1b, SW2a, and SW2b, and amplifier 7.

The S/H circuits 3 and 4 hold two residual signals amplified by an amplifier of the preceding AD converter 2-1, and then transfers the two held residual signals to the AD converter circuit 5 and the residual signal generator 6.

The AD converter circuit 5 outputs an AD conversion result of the residual signals. The AD converter circuit 5 in the AD converter 2-2 outputs an AD conversion result in accordance with a magnitude relationship between a plurality of reference signals set in accordance with the two residual signals and one of the two residual signals.

The residual signal generator 6 has a direct current-direct current (DC-DC) conversion function, and in response to the AD conversion result, determines two residual signals as differences, one between the input signal and one reference signal and the other between the input signal and the other reference signal. The residual signal generator 6 in the AD converter 2-2 generates as the first residual signal a difference between one of the two residual signals amplified and output by the preceding AD converter 2-1 and the reference signal closest in magnitude to the one residual signal. The residual signal generator 6 also generates as the second residual signal a difference between the one residual signal and the reference signal next closest to the residual one signal. The residual signal generator 6 may be implemented, using at least one of an application specific integrated circuit (ASIC), an integrated circuit (IC) and a field-programmable gate array (FPGA). One IC, one FPGA and/or one ASIC may include a plurality of residual signal generators 6.

The switch SW1a is turned on at a first timing, causing the amplifier 7 to amplify and output the first residual signal. The switch SW2a is turned on at a second timing different from the first timing, causing the amplifier 7 to amplify and output the second residual signal. The switch SW1b is turned on or of at the same timing as the switch SW1a. The switch SW2b is turned on or off at the same timing as the switch SW2a. The switches SW1a, SW1b, SW2a and SW2b are controlled by a switch control circuit.

Figure 2:
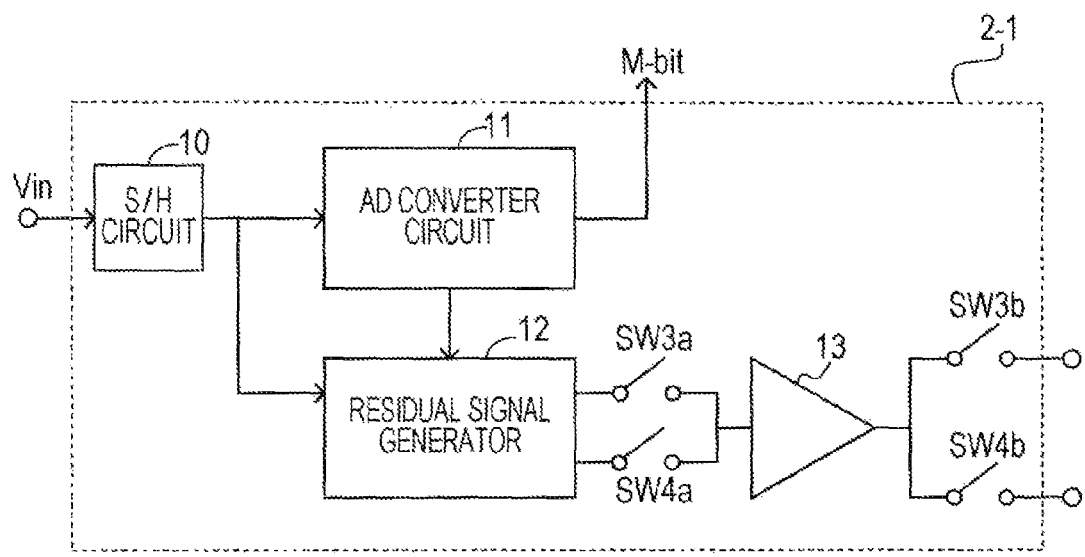
FIG. 2 illustrates an example of a first stage AD converter.

FIG. 2 illustrates an example of the AD converter at the first stage.

The first stage AD converter 2-1 includes S/H circuit 10, AD converter circuit 11, residual signal generator 12, switches SW3a, SW3b, SW4a, and SW4b, and amplifier 13.

The S/H circuit 10 holds a received analog signal Vin, and then supplies the analog signal Vin to the AD converter circuit 11 and the residual signal generator 12.

The AD converter circuit 11 outputs an AD conversion result responsive to the analog signal Vin. The AD converter circuit 11 in the preceding AD converter 2-1 outputs the AD conversion result in accordance with a magnitude relationship between a plurality of specific reference signals and the analog signal Vin.

The residual signal generator 12 has a DC-DC conversion function, and in response to the AD conversion result, determines two residual signals (analog signals) as differences, one difference between the analog signal Vin and one reference signal and the other difference between the analog signal. Vin and the other reference signal. The residual signal generator 12 in the AD converter 2-1 generates as the first residual signal a difference between the analog signal Vin and the reference signal closest in magnitude to the analog signal Vin. The residual signal generator 12 generates as the second residual signal a difference between the analog signal Vin and the reference signal next closest to the analog signal Vin.

The switches SW3a and SW4a are turned on at different timings, and the amplifier 13 then amplifies and outputs the generated first and second residual signals at different timings. The SW3b is turned on or off at the same timing as the SW3a. The SW4b is turned on or off at the same timing as the SW4a. The switches SW3a, SW3b, SW4a, and SW4b are controlled by the switch control circuit.

Figure 3:
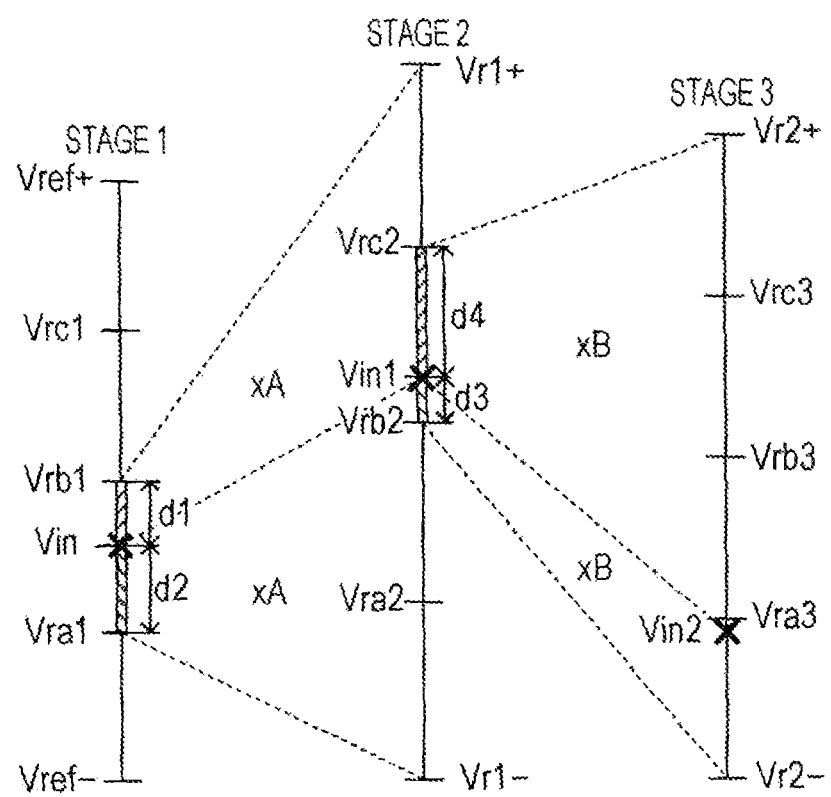
FIG. 3 illustrates an example of an AD conversion operation.

FIG. 3 illustrates an example of the AD conversion operation.

As illustrated in FIG. 3, the AD conversion operation with M=2 bits is performed. In the AD conversion operation at stage 1, the preceding AD converter 2-1 sets, reference signals Vra1, Vrb1, and Vrc1 so that a range between a specific reference signal Vref− to a specific reference signal Vref+ is segmented by four. For example, when the analog signal Vin received by the preceding AD converter 2-1 is Vref−≤Vin<Vra1, an AD conversion result is "00." When the analog signal Vin received by the preceding AD converter 2-1 is Vra1≤Vin<Vrb1, an AD conversion result is "01." When the analog signal Viii received by the preceding AD converter 2-1 is Vrb1≤Vin<Vrc1, an AD conversion result is "10." When the analog signal Vin received by the preceding AD converter 2-1 is Vrc1≤Vin≤Vref+, an AD conversion result is "11."

Since the analog signal Vin falls within a range of Vra1≤Vin<Vrb1 in FIG. 3, the preceding AD converter 2-1 outputs "01" as a Iwo bit AD conversion result.

The residual signal generator 12 in the preceding AD converter 2-1 generates a residual signal as a difference between the analog signal Vin and a reference signal closest in magnitude to the analog signal Vin. The residual signal generator 12 also generates a residual signal as a difference between the analog signal Vin and a reference signal next closest in magnitude to the analog signal Vin. In FIG. 3, the signal closest in magnitude to the analog signal Vin is the reference signal Vrb1 and the signal next closest to the analog signal Vin is the reference signal Vra1. A first residual signal d1 is d1=Vrb1−Vin and a second residual signal d2 is d2=Vin−Vra1.

The preceding AD converter 2-1 amplifies and outputs the residual signals d1 and d2 at different timings through switches SW3a, SW3b, SW4a, and SW4b. In FIG. 3, the amplifier 13 in the preceding AD converter 2-1 has a gain of "A."

Since the preceding AD converter 2-1 amplifies the residual signals d1 and d2 at the different timings through the same amplifier 13, offset variations, which may occur if a plurality of amplifiers are used, do not occur.

Through the AD conversion operation at stage 2, the S/H circuits 3 and 4 in the AD converter 2-2 holds the two residual signals that have been amplified and output from the preceding AD converter 2-1 at different timings.

The AD converter circuit 5 in the AD converter 2-2 sets the sum of the two residual signals as a full scale (corresponding to a magnitude of a difference between the reference signal Vr1− to the reference signal Vr1+) and sets, three reference signals Vra2, Vrb2, and Vrc2 to segment the full scale by four. The AD converter circuit 5 outputs an AD conversion result in accordance with the magnitude relationship of the reference signal and the residual signal (Vin1) which results from being amplified by A times.

If the residual signal Vin1 which results from multiplying the residual signal d2 by A is Vin1<Vra2, the AD conversion result is "00." When the residual signal Vin1 falls within a range of Vra2≤Vin1<Vrb2, the AD conversion result is "01." When the residual signal Vin1 falls within a range of Vrb2≤Vin1<Vrc2, the AD conversion result is "10." When the residual signal Vin1 falls within a range of Vrc2≤Vin1, the AD conversion result is "11."

The analog signal Vin falls within a range of Vrb2≤Vin1<Vrc2 in FIG. 3, the AD converter 2-2 outputs "10" as a 2-bit AD conversion result.

The residual signal generator 6 in the AD converter 2-2 generates as a first residual signal d3 a difference between the residual signal Vin1 and a reference signal closest in magnitude to the residual signal Vin1, and as a second residual signal d4 a difference between the residual signal Vin1 and a reference signal next closest in magnitude to the residual signal Vin1. As illustrated in FIG. 3, the reference signal closest in magnitude to the residual signal Vin1 is the reference signal Vrb2, and the reference signal next closest in magnitude to the residual signal Vin1 is the reference signal Vrc2. The first residual signal d3 is d3=Vin1−Vrb2, and the second residual signal d4 is d4=Vrc−Vin1.

The AD converter 2-2 amplifies and outputs the residual signals d3 and d4 at different timings through the switches SW1a, SW1b, SW2a, and SW2b, and the amplifier 7. As illustrated in FIG. 3, the AD converter 2-2 has an amplifier gain of "B." Optionally, the AD converter 2-2 may also have a gain of "A" as the preceding AD converter 2-1.

The AD converter 2-2 amplifies the residual signals d3 and d4 at different timings through the same amplifier 7, and offset variations, which may occur when a plurality of amplifiers are used, do not occur.

The AD converter 2-3 performing the AD conversion operation at stage 3 is identical in circuit structure to the AD converter 2-2, and thus performs the same AD conversion operation as that at stage 2. More specifically, the AD converter 2-3 sets the sum of the two residual signals amplified and output by the AD converter 2-2 as a full scale (corresponding to a magnitude of a difference between the reference signal Vr2− to the reference signal Vr2+). The AD converter 2-3 then sets up three reference signals Vra3, Vrb3, and Vrc3 that segment the full scale by four. The AD converter 2-3 then outputs an AD conversion result in accordance with a magnitude relationship between a residual signal Vin2 resulting from multiplying the residual signal d3 by B and each of these reference signals.

The AD converter 2-3 generates as a residual signal a difference between the residual signal Vin2 and a reference signal closest in magnitude to the residual signal Vin2, and as another residual signal a difference between the residual signal Vin2 and a reference signal next closest in magnitude to the residual signal Vin2. The AD converter 2-3 amplifies and outputs these residual signals at different timings.

The same operation as described above is performed by a stage subsequent to stage 3. The AD converter 2-N that performs an AD conversion operation at stage N is a final stage, and generates no residual signals. The AD converter 2-N has no counterparts corresponding to the residual signal generator 6, the amplifier 7, and the switches SW1a, SW1b, SW2a, and SW2b in FIG. 1.

An operation example of the AD converters performing the AD conversion operations at given stage k (1<k<N−1) and stage k+1 is described using a timing diagram below.

Figure 4:
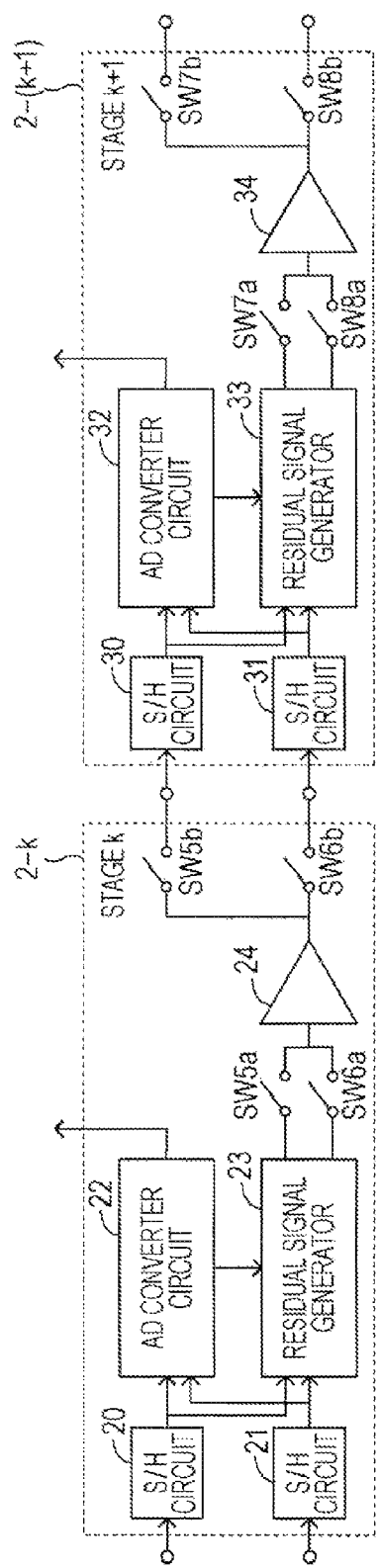
FIG. 4 illustrates an example of AD converters that perform the AD conversion operation at a stage k and a stage k+1.

FIG. 4 is an example of the AD converters that perform AD conversion operations at stage k and stage k+1.

Figure 5:
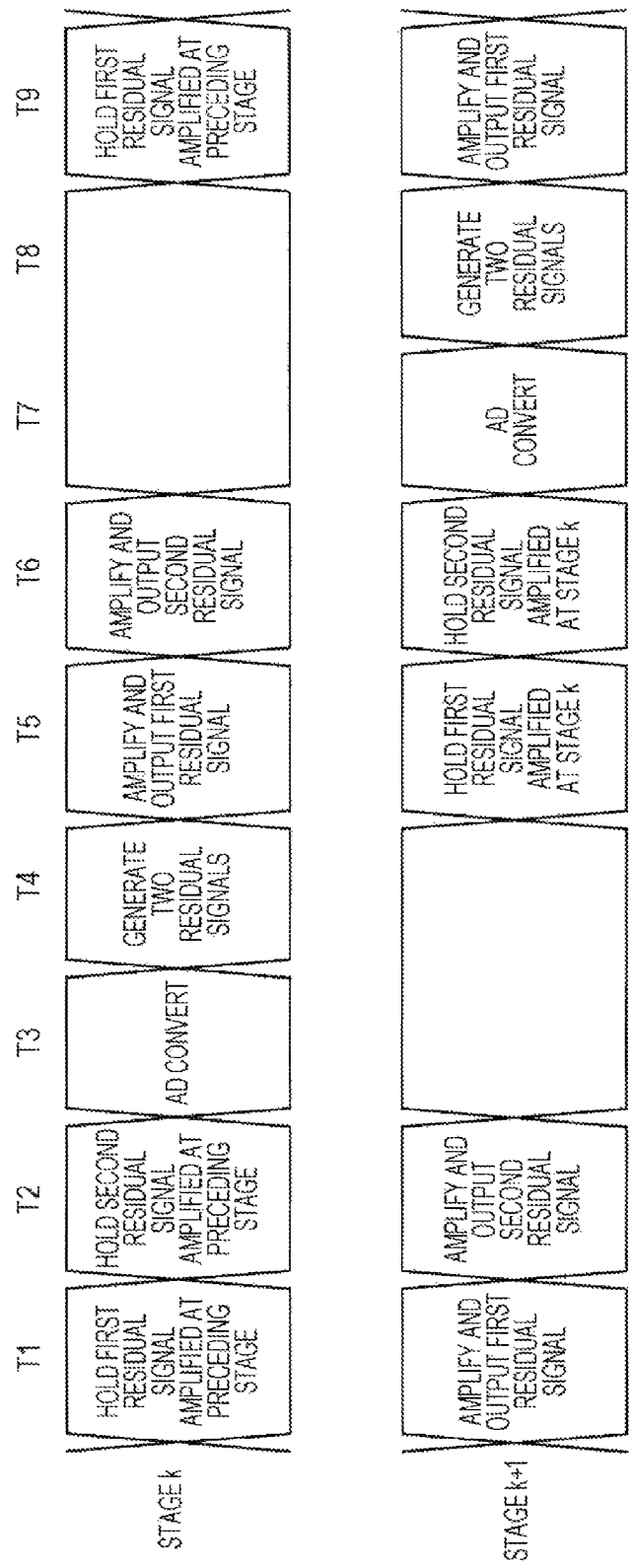
FIG. 5 illustrates an operational example of the AD converters at the stage k and the stage k+1.

FIG. 5 is a timing diagram of operation examples of the AD converters at stage k and stage k+1.

As illustrated in FIG. 4, the AD converters 2-k and 2-(k+1) that perform the AD conversion operations at stage k and stage k+1 include S/H circuits 20 and 21, S/H circuits 30 and 31, AD converter circuit 22, AD converter circuit 32, residual signal generator 23, residual signal generator 33, and amplifier 24, and amplifier 34, respectively. The AD converters 2-k and 2-(k+1) include switches SW5a, SW5b, SW6a and SW6b, and switches SW7a, SW7b, SW8a, and SW8b, respectively, The elements included in the AD converters 2-k and 2-(k+1) have functions identical to those included in the AD converter 2-2 of FIG. 1.

As illustrated in FIG. 5, the AD converter 2-k that performs the AD conversion operation at the stage k holds the first residual signal amplified by the preceding AD converter with the S/H circuit 20 at time T1, and holds the second residual signal amplified by the preceding AD converter with the S/H circuit 21 at time T2.

At time T1, the AD converter 2-(k+1) that performs the AD conversion operation at stage k+1 turns switches SW7a and SW7b on and turns switches SW8a and SW8b off. The first residual signal generated by the residual signal generator 33 is amplified by the amplifier 34 and then output. At time T2, the AD converter 2-(k+1) turns switches SW7a and SW7b off, and turns switches SW8a and SW8b on and the second residual signal generated by the residual signal generator 33 is amplified by the amplifier 34 and then output.

At time T3, the AD converter circuit 22 at, the AD converter 2-k performs the AD conversion operation on the two residual signal held by the S/H circuits 20 and 21, and at time T4, the residual signal generator 23 generates two residual signal.

At time T5, the AD converter 2-k turns switches SW5a and SW5b on, and turns switches SW6a and SW6b off, and the first residual signal generated by the residual signal generator is amplified by the amplifier 24 and then output. At time T6, the AD converter 2-k turns switches SW5a and SW5b off, and turns switches SW6a and SW6b on, and the second residual signal generated by the residual signal generator 23 is amplified by the amplifier 24 and then output.

At time T5, the S/H circuit 30 in the AD converter 2-(k+1) holds the first residual signal amplified and output by the AD converter 2-k at stage k. At time T6, the S/H circuit 31 in the AD converter 2-(k+1) holds the second residual signal amplified and output by the AD converter 2-k at stage k. At time 17, the AD converter circuit 32 in the AD converter 2-(k+1) performs the AD conversion operation on the two residual signal held by the S/H circuits 30 and 31. At time T8, the residual signal generator 33 generates two residual signal.

From time T9 on, the operations previously performed starting in time T1 are repeated.

As described above, in the AD converter apparatus 1 of the embodiment, at least one of the AD converters 2-1 through 2-N amplifies the two residual signals through the same amplifier at the different timings, and then outputs the amplified residual signals to a subsequent AD converter. Offset variations, which may occur if a plurality of amplifiers are used do not occur. Degradation in AD conversion accuracy is thus controlled.

Figure 6:
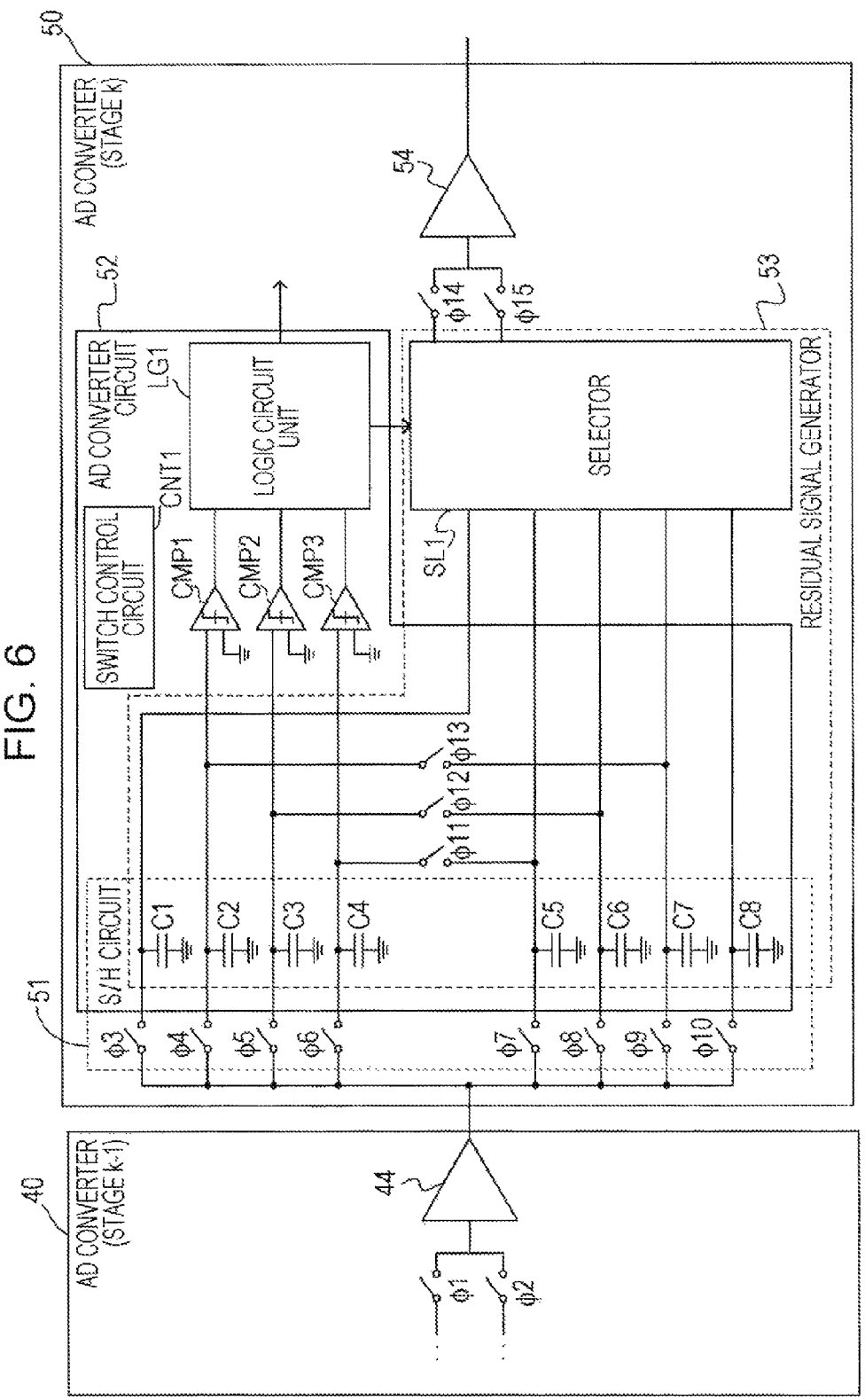
FIG. 6 illustrates an example of AD converters in an AD converter apparatus of a second embodiment.

FIG. 6 illustrates an example of an AD converter 50 in an AD converter apparatus of a second embodiment.

The AD converter 50 is an example of a pipeline type AD converter apparatus. The AD converter 50 performs an AD conversion operation at stage k (1<k<N), and outputs 2-bit AD conversion results. FIG. 6 also illustrates an AD converter 40 together with switches φ1 and φ2, and an amplifier 44 therewithin that performs an AD conversion operation at stage k−1.

The AD converter 50 includes switches φ3, φ4, φ5, φ6, φ7, φ8, φ9, φ10, φ11, φ12, φ13, φ14, and φ15, and capacitors C1, C2, C3, C4, C5, C6, C7, and C8. The AD converter 50 further includes comparators CMP1, CMP2, and CMP3, logic circuit switch control circuit CNT1, selector SL1, and amplifier 54.

One terminal of each of the switches φ3 through φ10 is connected to the output terminal of the amplifier 44. The other terminal of the switch φ3 is connected to one terminal of the capacitor C1 and the selector SL1. The other terminal of the switch φ4 is connected to one terminal of the capacitor C2, one terminal of the switch φ13, and one input terminal of the comparator CMP1. The other terminal of the switch φ5 is connected to one terminal of the capacitor C3, one terminal of the switch φ12, and one input terminal of the comparator CMP2. The other terminal of the switch φ6 is connected to one terminal of the capacitor C4, one terminal of the switch φ11, and one input terminal of the comparator CMP3.

The other terminal of the switch φ7 is connected to one terminal of the capacitor C5, the other terminal of the switch oil, and the selector SL1. The other terminal of the switch φ8 is connected to one terminal of the capacitor C6, the other terminal of the switch φ12, and the selector SL1. The other terminal of the switch φ9 is connected to one terminal of the capacitor C7, the other terminal of the switch φ13, and the selector SL1. The other terminal of the switch φ10 is connected to one terminal of the capacitor C8, and the selector SL1.

The other terminals of the capacitors C1 through C8 and the other input terminals of the comparators CMP1 through CMP3 are grounded. The output terminals of the comparators CMP1 through CMP3 are respectively connected to the logic circuit LG1.

The switches φ1 through φ15 may be metal-oxide semiconductor field-effect transistors (MOSFETs), for example.

The capacitors C1 through C4 hold a first residual signal amplified and output by the preceding AD converter 40. The capacitor C5 through C8 hold a second residual signal amplified and output by the preceding AD converter 40. The capacitors C1 through C8 have capacitances responsive to N reference signals set at AD conversion. In the embodiment, the capacitances of the capacitors C1 through C8 in the AD converter 50 are set so that the three reference signals are obtained to perform the 2-bit AD conversion operation. In the following example, the capacitances of the capacitors C1, C2, C4, C5, C6, and C8 are set to be C, and the capacitances of C3 and C7 are set to be 3C three times the capacitance C. In this way, the three reference signals for 2-bit AD conversion are generated as described below.

The logic circuit LG1 outputs an AD conversion result responsive to output signals from the comparators CMP1 through CMP3. The switch control circuit CNT1 controls the switches φ3 through φ15 for the operation of the AD converter 50 in response to a clock signal. Control wiring lines to transfer the control signals from the switch control circuit CNT1 to the switches φ3 through of φ15 are not illustrated in FIG. 6. The selector SL1 selects one of five input signals (analog signals) in response to an AD conversion result output from the logic circuit LG1. The selector SL1 is connected to the amplifier 54 via switches φ14 and φ15.

In the circuitry described above, the function of the S/H circuit 51 is implemented using the switches φ3 through φ10, the capacitors C1 through C8, and the switch control circuit CNT1. The function of the AD converter circuit 52 is implemented using the capacitors C1 through C8, the switches φ11 through φ13, the comparators CMP1 through CMP3, the switch control circuit CNT1, and the logic circuit LG1. The function of the residual signal generator 53 is implemented using the capacitors C1 through C8, the switches φ11 through φ13, the switch control circuit CNT1, and the selector SL1.

In the AD converter 50 of the second embodiment, the switches φ3 through φ10 perform the function of the switches SW1b and SW2b of FIG. 1 and other figures.

Figure 7:
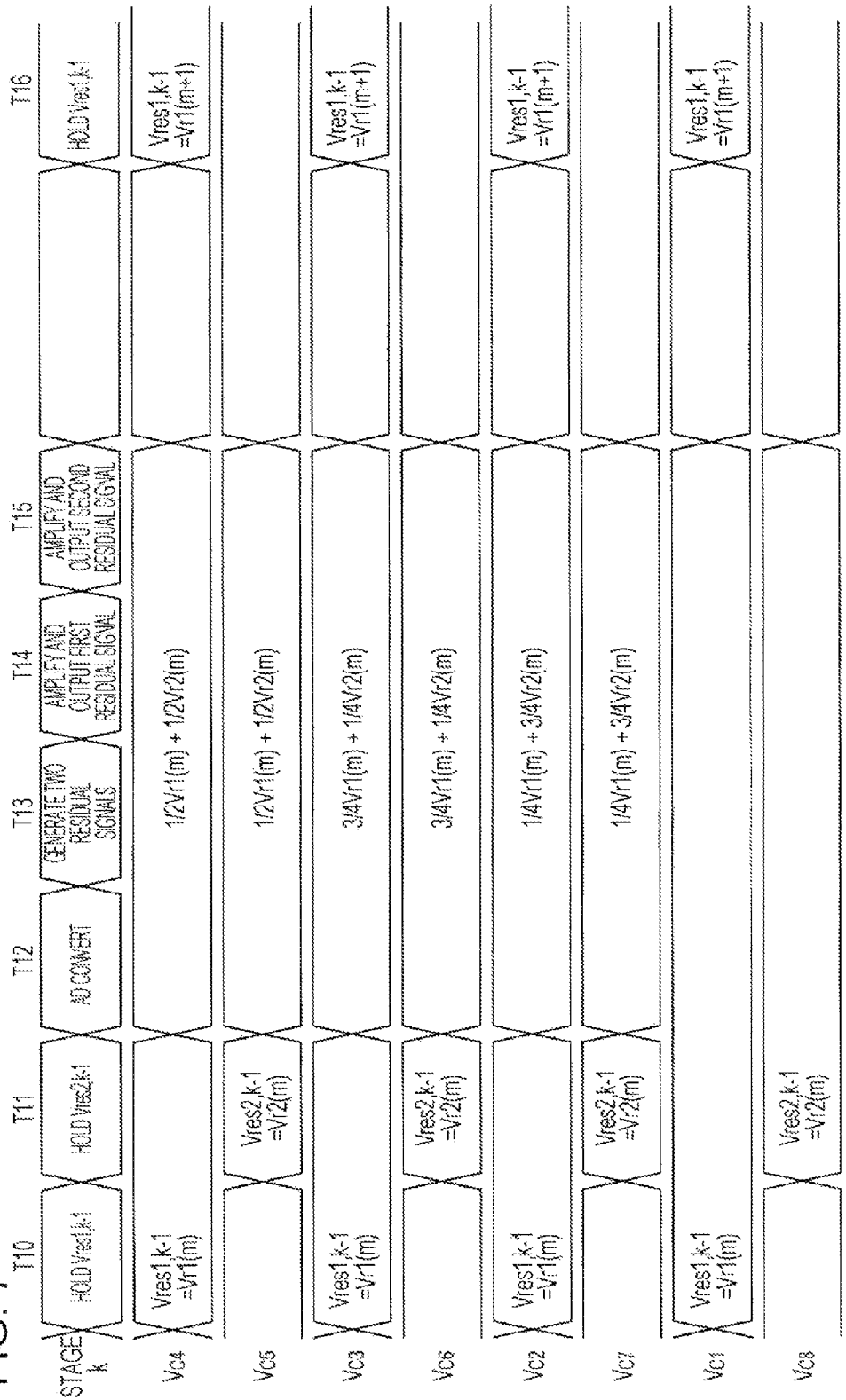
FIG. 7 illustrates an example of the AD conversion operation at the stage k.

FIG. 7 illustrates an example of the AD conversion operation at stage k.

FIG. 7 illustrates an operation example of the AD converter 50, and voltages $V_{C4}$, $V_{C5}$, $V_{C3}$, $V_{C6}$, $V_{C2}$, $V_{C7}$, $V_{C1}$, and $V_{C8}$ of capacitors C4, C5, C3, C6, C2, C7, C1, and C8 from top to bottom.

At time T10, the switch φ1 in the AD converter 40 is turned on, and a residual signals Vres1, k−1 amplified by the amplifier 44 is output from the AD converter 40. The switch control circuit CNT1 then turns on the switches φ3 through φ6, and turns off the switches φ7 through φ13 in the AD converter 50. In this way, the residual signal Vres1, k−1 is held by the capacitors C1 through C4. As a result, voltages $V_{C4}$, $V_{C3}$, $V_{C2}$, and $V_{C1}$ become a voltage Vr1(m) of the residual signal Vres1, k−1. The voltage Vr1(m) refers to a voltage value of the residual signals Vres1, k−1 at an m-th AD conversion operation.

At time T11, the switch φ2 in the AD converter 40 is turned on, and a residual signal Vres2, k−1 amplified by the amplifier 44 is output from the AD converter 40. The switch control circuit CNT1 then turns off the switches φ3 through φ6 and turns on the switches φ7 through φ10 in the AD converter 50. In this way, the switches φ11 through φ13 remain off. The residual signal Vres2, k−1 is held by the capacitors C5 through C8. As a result, the voltages $V_{C5}$, $V_{C6}$, and $V_{C8}$ become a voltage Vr2(m) of the residual signal Vres2, k−1 as illustrated in FIG. 7. The voltage Vr2(m) refers to a voltage value of the residual signals Vres2, k−1 at the m-th AD conversion operation.

At time T12, the switch control circuit CNT1 then turns off the switches φ3 through φ10 and turns on the switches φ11 through φ13 in the AD converter 50. In this way, the AD conversion operation is performed.

The voltage $V_{C4}$ and $V_{C5}$ become equal to each other since the switch φ11 is turned on, and have an average value of voltages $V_{C4}$ and $V_{C5}$ at time T11. More specifically, each of $V_{C4}$ and $V_{C5}$=Vr1(m)/2 Vr2(m)/2. The voltage $V_{C3}$ and $V_{C6}$ become equal, to each other since the switch φ12 is turned on. Since the capacitor C3 has a capacitance of 3C, and the capacitor C6 has a capacitance of C, each of $V_{C3}$ and $V_{C6}$=3Vr1(m)/4 Vr2(m)/4. The voltage $V_{C2}$ and $V_{C7}$ become equal to each other since the switch φ13 is turned on. More specifically, since the capacitor C2 has a capacitance of C, and the capacitor C7 has a capacitance of 3C, each of $V_{C2}$ and $V_{C7}$=Vr1(m)/4+3Vr2(m)/4.

Vfs(m)=Vr1(m)−Vr2(m) represents a full-scale voltage of the AD conversion. Here, conditions 0<Vr1(m)<Vfs(m) and −Vfs(m)<Vr2<0 hold.

Then, each of $V_{C4}$ and $V_{C5}$=Vr1(m)/2+Vr2(m)/2=Vr1(m)−Vfs(m)/2. Each of $V_{C3}$ and $V_{C6}$=3Vr1(m)/4+Vr2(m)/4=Vr1(m)−Vfs(m)/4. Each of $V_{C2}$ and $V_{C7}$=Vr1(m)/4+3Vr2(m)/4=Vr1(m)−3Vfs(m)/4.

If the voltage $V_{C2}$ is higher than ground potential, the comparator CMP1 outputs "1," and when the voltage $V_{C2}$ is equal to or lower than the ground potential, the comparator CMP1 outputs "0." Since the voltage $V_{C2}$ is represented by Vr1(m)−3Vfs(m)/4, the comparator CMP1 is understood as a unit that outputs a value responsive to comparison results of the voltage Vr1(m) of the residual signal Vres1, k−1 and the reference voltage 3Vfs(m)/4.

If the voltage $V_{C3}$ is higher than the ground potential, the comparator CMP2 outputs "1," and when the voltage $V_{C3}$ is equal to or lower than the ground potential, the comparator CMP1 outputs "0." Since the voltage $V_{C3}$ is represented by Vr1(m)−Vfs(m)/4, the comparator CMP2 is understood as a unit that outputs a value responsive to comparison results of the voltage Vr1(m) of the residual signal Vres1, k−1 and the reference voltage Vfs(m)/4.

If the voltage $V_{C4}$ is higher than the ground potential, the comparator CMP3 outputs "1," and when the voltage $V_{C4}$ is equal to or lower than the ground potential, the comparator CMP3 outputs "0" Since the voltage $V_{C4}$ is represented by Vr1(m)−Vfs(m)/2, the comparator CMP3 is understood as a unit that outputs a value responsive to comparison results of the voltage Vr1(m) of the residual signal Vres1, k−1 and the reference voltage Vfs(m)/2.

Figure 8:
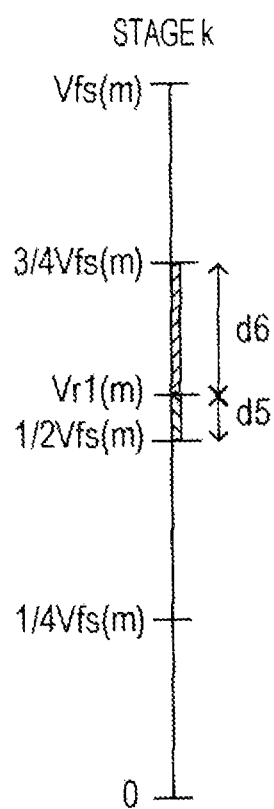
FIG. 8 illustrates a relation example between a reference voltage and a voltage of a residual signal.

FIG. 8 illustrates an example of a relationship between the reference signal and the voltage of the residual signal.

As illustrated in FIG. 8, the voltage Vr1(m) is higher than each of the reference voltages Vfs(m)/4 and Vfs(m)/2, and lower than the reference voltage 3Vfs(m)/4. Since $V_{C2}$=Vr1(m)−3Vfs(m)/4<0, the comparator CMP1 outputs "0." Since $V_{C3}$=Vr1(m)−Vfs(m)/4>0, the comparator CMP2 outputs "1." Since $V_{C4}$=Vr1(m)−Vfs(m)/2>0, the comparator CMP3 outputs "1."

If the comparators CMP1, CMP2, and CMP3 output "0," the logic circuit LG1 outputs "00" as a 2-bit AD conversion result of the voltage Vr1. When the comparator CMP2 outputs "1," and the comparators CMP1 and CMP3 output "0," the logic circuit LG1 output "01." When the comparators CMP2 and CMP3 output "1" and the comparator CMP1 outputs "0," the logic circuit LG1 outputs "10." When the comparators CMP1 through CMP3 output "1," the logic circuit LG1 outputs "11."

Since the comparator CMP1 outputs "0," and the comparators CMP2 and CMP3 output "1," the logic circuit LG1 outputs "10" in the example of FIG. 8.

In accordance with the AD conversion results, the residual signal generator 53 generates and outputs two residual signals at time T13 in FIG. 7.

If the logic circuit LG1 outputs "00," the selector SL1 outputs, as a first residual signal, $V_{C1}$=Vr1(m) and, as a second residual signal, $V_{C3}$ (=$V_{C6}$)=Vr1(m)−Vfs(m)/4 (negative value). When the logic circuit LG1 outputs "01," the selector SL1 outputs as a first residual value $V_{C3}$ (=$V_{C6}$)=Vr1(m)−Vfs(m)/4. The selector SL1 also outputs as a second residual signal $V_{C4}$ (=$V_{C5}$)=Vr1(m)−Vfs(m)/2 (negative value).

If the logic circuit LG1 outputs "10," the selector SL1 outputs as a first residual signal $V_{C4}$ (=$V_{C5}$)=Vr1(m)−Vfs(m)/2. The selector SL1 also outputs as a second residual signal $V_{C2}$ (=$V_{C7}$)Vr1(m)−3Vfs(m)/4. When the logic circuit LG1 outputs "11," the selector SL1 outputs as a first residual value $V_{C2}$ (=$V_{C7}$)=Vr1(m)−3Vfs(m)/4. The selector SL1 also outputs as a second residual signal $V_{C8}$=Vr2(m).

The logic circuit LG1 of FIG. 8 outputs "10," the selector SL1 outputs, as a first residual signal d5, Vr1−Vfs/2, and as a second residual signal d6, Vr1(m)−Vfs(m)/2 (negative value).

If the two residual signal values are generated as described above, the switch control circuit CNT1 turns the switch φ14 on and turns off the switch φ15 at time T14 in the timing diagram of FIG. 7. The first residual signal is thus amplified by the amplifier 54 and then output as a residual signal Vres1, k. At time T15, the switch control circuit CNT1 turns off the switch φ14, and turns on the switch φ15. In this way, the second residual signal is amplified by the amplifier 54 and is then output as a residual signal Vres2, k.

At the beginning of a next period, an (m+1)-th AD conversion operation starts at time T16 in the same manner as at time T10.

The AD converter 50 thus constructed is applicable as a pipeline-type flash AD converter apparatus and a successive approximation register (SAR) AD converter apparatus.

At different timings, the AD converter 50 thus amplifies the two residual signals through the same amplifier 54 and then outputs the amplified residual signals to a subsequent AD converter. Offset variations, which may occur if a plurality of amplifiers are used, do not occur. Degradation in the AD conversion accuracy is thus controlled.

The capacitors C1 through C4 and the capacitors C5 through C8 in the S/H 51 hold the two residual signals amplified by the preceding AD converter 40 at mutually different timings. The two amplified residual signals output from the preceding AD converter 40 at the different timings are held, and the AD conversion operation and the residual signal generation thereafter are then performed on the residual signals at subsequent timings.

In the AD converter 50, the three capacitors C2 through C4 are respectively connected to the three capacitors C5 through C7 at the same timing to set the three reference signals at the same time to perform the AD conversion. The AD conversion is thus efficiently performed.

Figure 9:
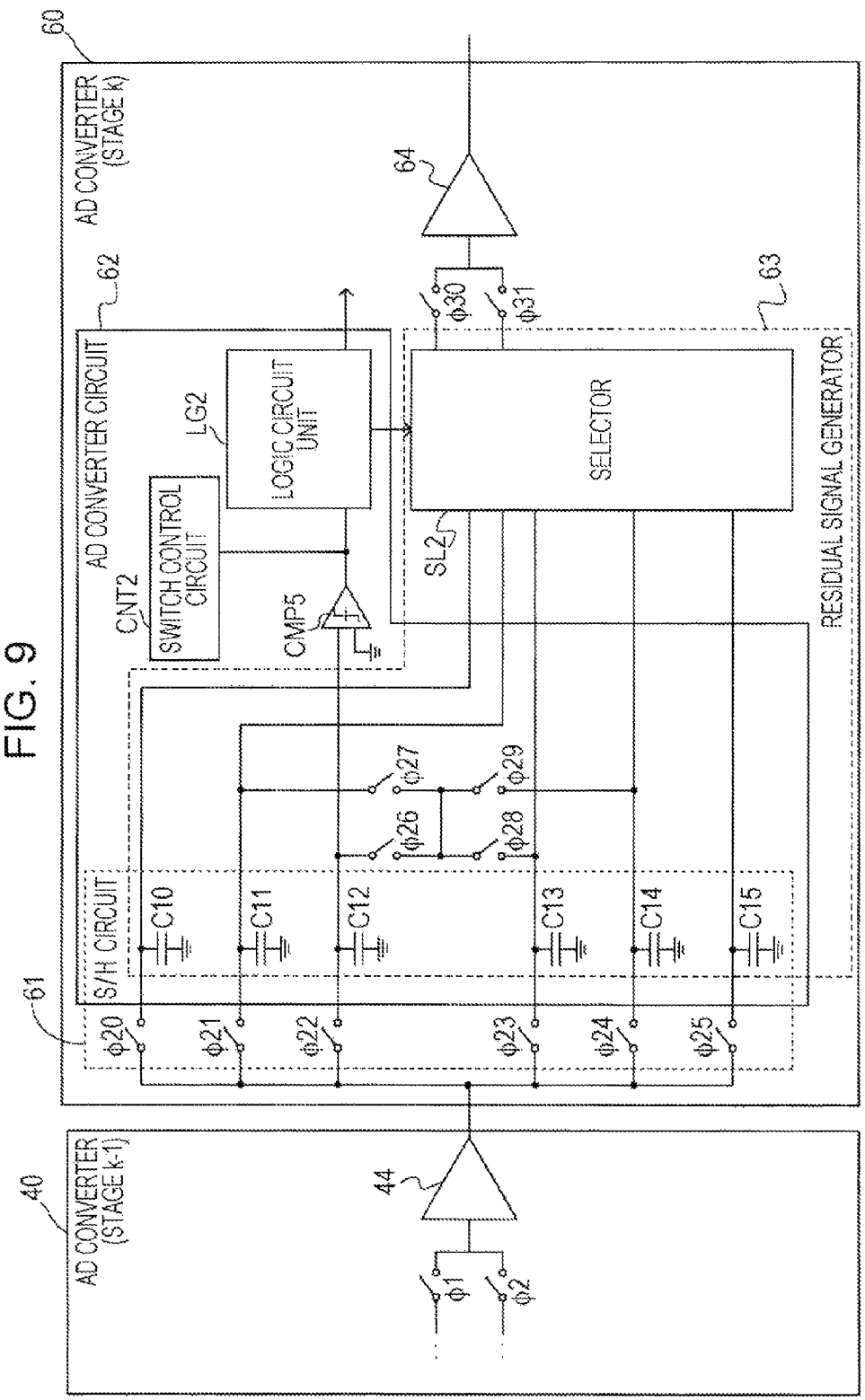
FIG. 9 illustrates an example of AD converters in an AD converter apparatus of a third embodiment.

FIG. 9 illustrates an AD converter 60 of an AD converter apparatus of a third embodiment.

The AD converter 60 is an example of a pipeline type AD converter apparatus. The AD converter 60 performs an AD conversion operation at stage k (1<k<N), and outputs 2-bit AD conversion results, FIG. 6 also illustrates an AD converter 40 together with switches φ1 and φ2, and an amplifier 44 therewithin that performs an AD conversion operation at stage k−1.

The AD converter 60 includes switches φ20, φ21, φ22, φ23, φ24, φ25, φ26, φ27, φ28, φ29, φ30, and φ31, and capacitors C10, C11, C12, C13, C14, and C15. The AD converter 60 further includes comparator CMP5, logic circuit LG2, switch control circuit CNT2, selector SL2, and amplifier 64.

One terminal of each of the switches φ20 through φ25 is connected to the output terminal of the amplifier 44. The other terminal of the switch φ20 is connected to one terminal of the capacitor C10 and the selector SL2. The other terminal of the switch φ21 is connected to one terminal of the capacitor C11, one terminal of the switch φ27, and the selector SL2. The other terminal of the switch φ22 is connected to one terminal of the capacitor C12 one terminal of the switch φ26 and one input terminal of the comparator CMP5.

The other terminal of the switch φ23 is connected to one terminal of the capacitor C13, one terminal of the switch φ28, and the selector SL2.

The other terminal of the switch φ24 is connected to one terminal of the capacitor C14, one terminal of the switch φ29, and the selector SL2. The other terminal of the switch φ25 is connected to one terminal of the capacitor C15, and the selector SL2. The other terminal of the switch φ25 is connected to one terminal of the capacitor C15, and the selector SL2.

The other terminals of the capacitors C10 through C15 and the other input terminal of the comparator CMP5 are grounded. The output terminal of the comparator CMP5 is connected to the logic circuit LG2 and the switch control circuit CNT2. The other terminals of the switches φ26 through φ29 are connected together.

The switches φ20 through φ31 may be MOSFETs, for example.

The capacitors C10 through C12 hold a first residual signal amplified and output by the preceding AD converter 40. The capacitor C13 through C15 hold a second residual signal amplified and output by the preceding AD converter 40. In the following discussion, the capacitors C10 through C15 have the same capacitance value i.e., C.

The logic circuit LG2 outputs an AD conversion result responsive to an output signal from the comparator CMP5. The switch control circuit CNT2 controls the output signal of the comparator CMP5 and the switches φ20 through φ30 for the operation of the AD converter 60 in response to a clock signal. Control wiring lines to transfer the control signals from the switch control circuit CNT2 to the switches φ20 through φ30 are not illustrated in FIG. 9. The selector SL2 selects and output one of five input signals (analog signals) in response to an AD conversion result output from the logic circuit LG2. The selector SL2 is connected to the input terminal of the amplifier 64 via switches φ30 and φ31.

In the circuitry described above, the function of the S/H circuit 61 is implemented using the switches φ20 through φ25, the capacitors C10 through C15, and the switch control circuit CNT2. The function of the AD converter circuit 62 is implemented using the capacitors C10 through C15, the switches φ20 through φ29, the comparator CMP5, the switch control circuit CNT2, and the logic circuit LG2. The function of the residual signal generator 63 is implemented using the capacitors C10 through C15, the switches φ20 through φ29, the switch control circuit CNT2, and the selector SL2.

Figure 10:
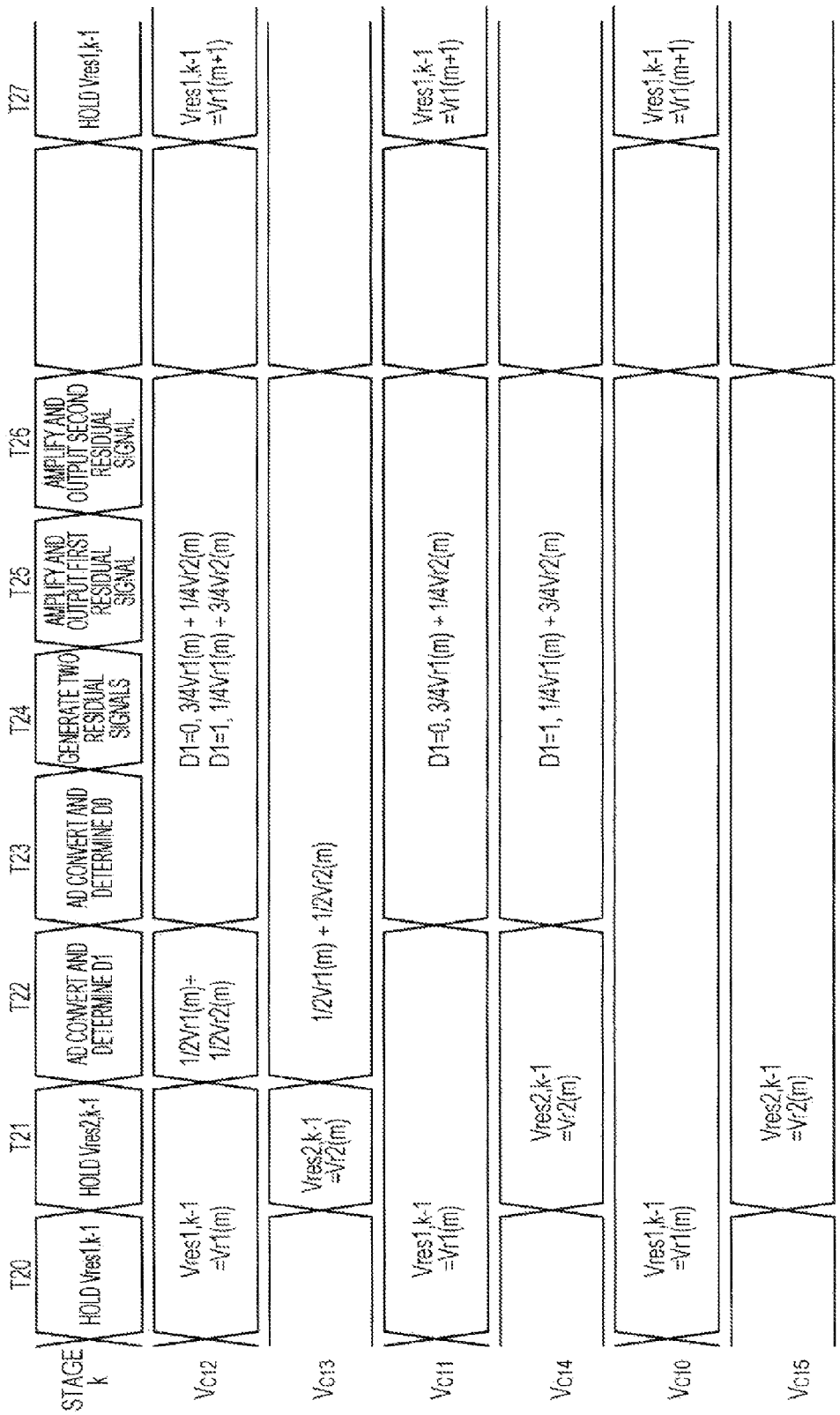
FIG. 10 illustrates an example of the AD conversion operation at the stage k of the third embodiment.

FIG. 10 illustrates an example of the AD conversion operation at stage k in accordance with the third embodiment.

FIG. 10 illustrates an operation example of the AD converter 60, and the voltages $V_{C12}$, $V_{C13}$, $V_{C11}$, $V_{C14}$, $V_{C10}$, and $V_{C15}$ of the capacitors C12, C13, C11, C14, C10, and C15 from top to bottom.

At time T20, the switch φ1 in the AD converter 40 is turned on, and a residual signal Vres1, k−1 amplified by the amplifier 44 is output from the AD converter 40. The switch control circuit CNT2 then turns on the switches φ20 through φ22, and turns off the switches φ23 through φ29 in the AD converter 60. In this way, the residual signal Vres1, k−1 is held by the capacitors C10 through C12. As a result, voltages $V_{C12}$, $V_{C11}$, $V_{C2}$, and $V_{C10}$ become a voltage Vr1(m) of the residual signal Vres1, k−1. The voltage Vr1(m) refers to a voltage value of the residual signals Vres1, k−1 at an m-th AD conversion operation.

At time T21, the switch φ2 in the AD converter 40 is turned on, and a residual signal Vres2, k−1 amplified by the amplifier 44 is output from the AD converter 40. The switch control circuit CNT2 then turns off the switches φ20 through φ22 and turns on the switches φ23 through φ25 in the AD converter 60. In this way, the switches φ26 through φ29 remain off. The residual signal Vres2, k−1 is thus held at the capacitors C13 through C15. As a result, the voltages $V_{C13}$, $V_{C14}$, and $V_{C15}$ become a voltage Vr2(m) of the residual signal Vres2, k−1. The voltage Vr2(m) refers to a voltage value of the residual signals Vres2, k−1 at the m-th AD conversion operation.

At time T22, an AD conversion operation is performed to determine an upper bit D1 in the 2-bit AD conversion results. The switch control circuit CNT2 then turns off the switches φ20 through φ25, φ27, and φ29, and turns on the switches φ26 and φ28 in the AD converter 60. Since the switches φ26 and φ28 are on, the voltage $V_{C12}$ and $V_{C13}$ become equal to each other. More specifically, each of $V_{C12}$ and $V_{C13}$ Vr1(m)/2 Vr2(m)/2.

Vfs(m)=Vr1(m)−Vr2(m) represents a full-scale voltage of the AD conversion. Here, conditions 0<Vr1(m)<Vfs(m) and −Vfs(m)<Vr2(m)<0 hold. Then, each of $V_{C12}$ and $V_{C13}$=Vr1(m)/2+Vr2(m)/2=Vr1(m)−Vfs(m)/2. When the voltage $V_{C12}$ is higher than the ground potential, the comparator CMP5 outputs "1," and when the voltage $V_{C12}$ is equal to or lower than the ground potential, the comparator CMP5 outputs "0," Since the voltage $V_{C12}$ is represented by Vr1(m)−Vfs(m)/2, the comparator CMP5 is understood as a unit that outputs a value responsive to comparison results of the voltage Vr1(m) of the residual signal Vres1, k−1 and the reference voltage Vfs(m)/2. When the voltage Vr1(m) is higher than Vfs/2, the upper bit D1 becomes "1," and when the voltage Vr1(m) is equal to or lower than Vfs(m)/2, the upper bit D1 becomes "0."

At time T23, the switch control circuit CNT2 turns on and off the switches φ26 through φ29 in response to the value of the upper bit D1 determined at time T22.

If the upper bit D1 is "0," the switch control circuit CNT2 turns on the switches φ26 and φ27, and turns off the switches φ28 and φ29. The voltage $V_{C11}$ and $V_{C12}$ become equal to each other since the switches φ26 and φ27 are on, and have an average value of voltages $V_{C12}$ and $V_{C11}$ at time T22. More specifically, each of $V_{C11}$ and $V_{C12}$=3Vr1(m)/4 Vr2(m)/4. Thus, $V_{C11}$, $V_{C12}$=3Vr1(m)/4+Vr2(m)/4=Vr1(m)−Vfs(m)/4.

The comparator CMP5 thus outputs a value responsive to comparison results of the voltage Vr1(m) of the residual signals Vres1, k−1 and the reference voltage Vfs(m)/4. When Vr1(m)>Vfs(m)/4, the comparator CMP5 outputs "1." The logic circuit LG2 then outputs "01" as an AC conversion result. When Vr1(m)≤Vfs(m)/4, the comparator CMP5 outputs "0." The logic circuit LG2 then outputs "00" as an AD conversion result.

If the upper bit D1 is "1," the switch control circuit CNT2 turns on the switches φ26 and φ29, and turns off the switches φ27 and φ28. The voltage $V_{C12}$ and $V_{C14}$ become equal to each other since the switches φ26 and φ29 are on, and have an average value of voltages $V_{C12}$ and $V_{C14}$ at time T22. More specifically, each of $V_{C12}$ and $V_{C14}$=Vr1(m)/4+3Vr2(m)/4. Thus, $V_{C12}$, $V_{C14}$=VR1(m)/4+3Vr2(m)/4=Vr1(m)−3Vfs(m)/4.

The comparator CMP5 thus outputs a value responsive to comparison results of the voltage Vr1(m) of the residual signals Vres1, k−1 and the reference voltage 3Vfs(m)/4. When Vr1(m)>3Vfs(m)/4, the comparator CMP5 outputs "1." The logic circuit LG2 then outputs "11" as an AC conversion result. When Vr1(m)≤3Vfs(m)/4, the comparator CMP5 outputs "0." The logic circuit LG2 then outputs "10" as an AD conversion result.

In response to the AD conversion results, the residual signal generator 63 generates and outputs two residual signals at time T24 of FIG. 10.

For example, when the logic circuit LG2 outputs "00," the selector SL2 outputs as a first residual signal $V_{C10}$=Vr1(m) and as a second residual signal $V_{C11}$=Vr1(m)−Vfs(m)/4 (negative value). When the logic circuit LG2 outputs "01," the selector SL2 outputs as a first residual value $V_{C11}$=Vr1(m)−Vfs(m)/4. The selector SL2 also outputs as a second residual signal $V_{C13}$=Vr1(m)−Vfs(m)/2 (negative value).

If the logic circuit LG2 outputs "10," the selector SL2 outputs as a first residual signal $V_{C13}$=Vr1(m)−Vfs(m)/2. The logic circuit LG2 also outputs as a second residual signal $V_{C14}$=Vr1(m)−3Vfs(m)/4 (negative value). When the logic circuit LG2 outputs "11," the selector SL1 outputs as a first residual value $V_{C14}$=Vr1(m)−3Vfs(m)/4. The selector SL2 also outputs as a second residual signal $V_{C15}$=Vr2(m) as a negative value.

If the two residual signal values are generated as described above, the switch control circuit CNT2 turns on the switch φ30 and turns off the switch φ31 at time T25 in the timing diagram of FIG. 10. The first residual signal is thus amplified by the amplifier 64 and then output as a residual signal Vres1, k. At time T26, the switch control circuit CNT2 turns off the switch φ30, and turns on the switch φ31. In this way, the second residual signal is amplified by the amplifier 64 and is then output as a residual signal Vres2, k.

At the beginning of a next period, an (m+1)-th AD conversion operation starts at time T27 in the same manner as at time T20.

The AD converter 60 this constructed is applicable as a successive approximation register (SAR) AD converter apparatus.

At different timings, the AD converter 60 thus amplifies the two residual signals through the same amplifier 64 and then outputs the amplified residual signals to a subsequent AD converter. Offset variations, which may occur if a plurality of amplifiers are used do not occur. Degradation in the AD conversion accuracy is controlled.

The capacitors C10 through C12 and the capacitors C13 through C15 in the S/H 61 hold the two residual signals amplified by the preceding AD converter 40 at mutually different timings. The two amplified residual signals output from the preceding AD converter 40 at the different timings are held, and the AD conversion operation and the residual signal generation thereafter are then performed on the residual signals at subsequent timings.

In the AD converter 60, the capacitors C12 through C13 are connected to set the reference signal to perform the first AD conversion. The upper bit is thus determined. In response to a first AD conversion result, the AD converter 60 determines a capacitor to be connected to the capacitor C12, and sets a reference signal to perform a second AD conversion, and then sets a lower bit. The arrangement sets the AD converter 60 that performs the 2-bit AD conversion from an operation of setting the three reference signals. The number of capacitors in use is reduced. A circuit area of the AD conversion apparatus is reduced accordingly.

The AD converter 60 may be combined with the AD converter 50. For example, the AD converter 60 may be used at stage k and the AD converter 50 may be used at stage k+1.

The AD conversion apparatus and the AD conversion method as the embodiments have been described for exemplary purposes only. The embodiments are not limited to those described above.

Each AD converter outputs an AD conversion result by 2 bit at a time. The embodiments are not limited to this arrangement. AD conversion results may be output every bit, or every 3 or more bits. In such a case, the circuit may be modified as appropriate. For example, if the AD conversion results are output every 3 or more bits, the numbers of capacitors and switches may be increased or capacitance values of the capacitors may be changed in response to the number of reference signals and voltage values in use in the circuits of FIG. 6 and FIG. 9.

In the embodiments, the number of bits as an AD conversion result output by the AD converter may be different from stage to stage of AD conversion.

The amplifier may be an open-loop amplifier. Optionally, a closed-loop amplifier may be employed to precisely control gain. However, since the AD converter apparatus outputs the two residual signals amplified by a single amplifier, accuracy degradation is controlled even with the open-loop amplifier in comparison with the case with a plurality of amplifiers being used.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An analogue-digital converter apparatus, comprising:
   a plurality of AD converters connected in series, each AD converter to convert an analog signal received by a first AD converter,
   at least one of the AD converters including:
   a residual signal generator that generates a first residual signal, the first residual signal being a difference between the analog signal or one of two residual signals amplified and output by a preceding AD converter and a first reference signal, and a second residual signal, the second residual signal being a difference between the analog signal or one of the two residual signals and a second reference signal; and
   an amplifier that amplifies and outputs the first residual signal to a subsequent AD converter at a first timing and amplifies and outputs the second residual signal to the subsequent AD converter at a second timing,
   wherein the first reference signal and the second reference signal are set in accordance with the two residual signals amplified and output by the preceding AD converter.

2. The AD converter apparatus according to claim 1, wherein at least one of the plurality of AD converters comprises a first capacitor group that stores at a third timing one of the two residual signals amplified and output by the preceding AD converter, and a second capacitor group that stores at a fourth timing the other of the two residual signals.

3. The AD converter apparatus according to claim 2, wherein capacitors included in the first capacitor group and the second capacitor group have capacitances responsive to N reference signals set at an AD conversion operation, and
   wherein at least one of the plurality of AD converters performs the AD conversion operation by setting the N reference signals through connecting N capacitors included in the first capacitor group to N capacitors included in the second capacitor group respectively at a fifth timing subsequent to the fourth timing.

4. The AD converter apparatus according to claim 2, wherein at least one of the plurality of AD converters determines a first bit by performing a first AD conversion operation through setting a first reference signal by connecting a first capacitor included in the first capacitor group to a second capacitor included in the second capacitor group at a sixth timing subsequent to the fourth timing, and
   in response to a result of the first AD conversion operation, determines a second bit one bit lower than the first bit by performing a second AD conversion operation through setting a second reference signal by connecting the first capacitor to a third capacitor included in the first capacitor group or to a fourth capacitor included in the second capacitor group at a seventh timing subsequent to the sixth timing.

5. An analogue-digital conversion method of a plurality of AD converters connected in series, each AD converter to convert an analog signal received by a first AD converter, comprising:
   generating a first residual signal, the first residual signal being a difference between the analog signal or one of two residual signals amplified and output and by a preceding AD converter and a first reference signal, and a second residual signal, the second residual signal being a difference between the analog signal or one of the two residual signals and a second reference signal;

amplifying and outputting the first residual signal to a subsequent AD converter at a first timing; and amplifying and outputting the second residual signal to the subsequent AD converter at a second timing;

wherein the first reference signal and the second reference signal are set in accordance with the two residual signals amplified and output by a preceding AD converter.

6. An analogue-digital converter, comprising:

a first AD converter circuit that AD converts a received analog signal;

a residual signal generator circuit that generates as a first residual signal a difference between the analog signal and a first reference signal, and as a second residual signal a difference between the analog signal and a second reference signal;

an amplifier that amplifies and outputs the first residual signal at a first timing and amplifies and outputs the second residual signal at a second timing different from the first timing; and a second AD converter circuit that receives the first residual signal and the second residual signal and sets a magnitude of a difference between a third reference signal and a fourth reference signal as the sum of the first residual signal and the second residual signal, wherein the second AD converter circuit AD converts the first residual signal and the second residual signal.

7. The AD converter apparatus according to claim 1, wherein a magnitude of a difference between the first reference signal and the second reference signal is the sum of the two residual signals.

8. The AD converter apparatus according to claim 7, further comprising a sample-hold (S/H) circuit configured to set three reference signals to segment a scale from the first reference signal to the second reference signal by four.

9. The analogue-digital conversion method of claim 5, further comprising:

setting the sum of the two residual signals as a full scale corresponding to a magnitude of a difference between the first reference signal and the second reference signal; and setting three reference signals to segment the full scale by four.

* * * * *